United States Patent
Boe

[11] Patent Number: 6,158,699
[45] Date of Patent: Dec. 12, 2000

[54] APPARATUS FOR MOUNTING COMPUTER COMPONENTS

[75] Inventor: Craig L. Boe, Nampa, Id.

[73] Assignee: Micron Electronics, Inc., Nampa, Id.

[21] Appl. No.: 09/429,505

[22] Filed: Oct. 28, 1999

Related U.S. Application Data

[63] Continuation of application No. 08/926,608, Sep. 10, 1997.

[51] Int. Cl.$^7$ ................................................. G12B 9/00
[52] U.S. Cl. .................. 248/27.1; 248/27.3; 361/683; 361/686
[58] Field of Search ............................ 248/27.1, 27.3; 312/265.6; 361/683, 686

[56] References Cited

U.S. PATENT DOCUMENTS

| | | | |
|---|---|---|---|
| 2,311,410 | 2/1943 | Meyer | 180/83 |
| 2,443,362 | 6/1948 | Tinnerman | 70/370 |
| 2,590,264 | 3/1952 | Meyers et al. . | |
| 2,627,385 | 2/1953 | Tinnerman | 248/27.1 |
| 2,659,950 | 11/1953 | West . | |
| 2,703,662 | 3/1955 | Meyer | 220/3.6 |
| 3,154,281 | 10/1964 | Frank . | |
| 3,258,033 | 6/1966 | Ohnstad . | |
| 3,345,029 | 10/1967 | Palmer | 248/300 |
| 3,368,780 | 2/1968 | Buttriss | 248/27 |
| 3,613,177 | 10/1971 | Davis | 248/27 |
| 3,614,749 | 10/1971 | Grube, Jr. | 248/27 |
| 3,681,593 | 8/1972 | Genovese et al. | 248/27 |
| 3,909,908 | 10/1975 | Brefka . | |
| 3,963,204 | 6/1976 | Liss | 248/27.1 |
| 4,126,923 | 11/1978 | Cislak et al. . | |
| 4,383,716 | 5/1983 | Osborn | 24/295 |
| 4,577,818 | 3/1986 | Clarisse | 248/27.3 |
| 4,756,495 | 7/1988 | Putnam | 248/27.3 |
| 4,874,977 | 10/1989 | Safranek | 248/27.3 |
| 4,878,153 | 10/1989 | Loris . | |
| 5,015,802 | 5/1991 | Chi . | |
| 5,193,792 | 3/1993 | Di Marco . | |
| 5,236,157 | 8/1993 | Reggiani | 248/27.1 |
| 5,320,311 | 6/1994 | Jensen et al. | 248/27.1 |
| 5,545,843 | 8/1996 | Arvidsson et al. | 24/293 |
| 5,596,170 | 1/1997 | Barina et al. | 174/35 R |
| 5,757,618 | 5/1998 | Lee . | |

*Primary Examiner*—Ramon O. Ramirez
*Assistant Examiner*—Kimberly Wood
*Attorney, Agent, or Firm*—Perkins Coie LLP

[57] ABSTRACT

An attachment assembly for removably mounting a computer component to a chassis. The assembly includes first and second engaging members. The first engaging member has a first protrusion which extends away from the first engaging member and is received by a first aperture positioned in a first surface of the component. The second engaging member has a second protrusion extending away therefrom and is received by a second aperture positioned in a second surface of the component to substantially prevent motion of the assembly relative to the component. The assembly further includes a chassis coupling member which engages first and second surfaces of the chassis to restrict motion of the assembly and the component to which it is attached relative to the chassis.

27 Claims, 3 Drawing Sheets

APPARATUS FOR MOUNTING COMPUTER COMPONENTS

This application is a continuation of Ser. No. 08/926,608 filed Sep. 10, 1997.

TECHNICAL FIELD

The present invention is directed toward an attachment assembly for removably mounting a computer component to a chassis.

BACKGROUND OF THE INVENTION

Computer components such as floppy disk drives, hard disk drives, CD-ROM drives and the like are typically manufactured separately from the computer housing or chassis and are then mounted in the computer chassis during final assembly. The chassis may take the form of a floor-mounted "tower" unit or a desk-mounted unit. In either case, the chassis has a slot positioned to receive the component. Two brackets are mounted to the component so that when the component is inserted into the slot, the brackets engage the slot and secure the component therein. The component is inserted into the chassis slot when the computer is assembled, and may later be removed for servicing or replacement.

FIG. 1 illustrates a conventional computer chassis 10 having an aperture 20 sized to receive a floppy disk drive 30. A bracket 40 is attached to each side of the floppy disk drive 30. Each bracket 40 has a clip 42 in which a transverse channel 43 is formed. The transverse channel 43 engages an edge of the aperture 20 to prevent the floppy disk drive 30 from unintentionally sliding out of the aperture.

In one conventional installation, the bracket 40 is attached to the disk drive 30 by inserting a dimple 44 of the bracket into a first threaded hole 36 of the disk drive. A screw 50 is then passed through a hole 45 in the bracket 40 and threaded into a second threaded hole 38 of the disk drive 30. In one alternate conventional installation, the screw 50 is eliminated and the dimple 44 alone secures the bracket 40 to the disk drive 30. In another alternate conventional installation, the dimple 44 is replaced with a hole (not shown), and the screw 50 is passed through the hole and threaded into the first threaded hole 36 of the disk drive 30 to attach the bracket 40 to the disk drive.

The conventional methods for attaching the bracket 40 to the disk drive 30 suffer from several drawbacks. Where the screw 50 is threaded through the second threaded hole 38, the head of the screw may catch on an edge of the aperture 20 as the disk drive 30 is inserted into the aperture. As a result, the aperture 20 may not completely receive the disk drive 30 and the disk drive may move about within the aperture, possibly causing damage to the chassis or the disk drive. Alternatively, if the screw 50 catches on the aperture 20 and the disk drive 30 is nevertheless forced into the aperture 20, metal chips may be stripped from the head of the screw and may damage components within the computer chassis. The damaged screw 50 may also make removal of the bracket 40 for servicing difficult.

Where the screw 50 is eliminated, the dimple 44 only loosely secures the bracket 40 to the disk drive 30, possibly allowing the disk drive to move about within the aperture 20. Where the screw 50 is threaded through the first threaded hole 36, the screw may again catch on the aperture 20. Furthermore, threading or unthreading the screw 50 to install or remove the bracket 40 is a time consuming operation.

In addition to the foregoing drawbacks, the clip 42 may not adequately engage the chassis 10. As a result, the disk drive 30 may move within the aperture 20, possibly causing damage to the chassis or the disk drive, as discussed above.

SUMMARY OF THE INVENTION

The present invention is directed, in part, toward an apparatus for removably mounting a computer component to a chassis. In one embodiment, an attachment assembly in accordance with the invention comprises a first engaging member in which a first protrusion is formed. The first protrusion is sized and shaped to engage a first aperture in a first surface of the computer component when the first engaging member is positioned at least proximate to the first surface. The attachment assembly further comprises a second engaging member connected to the first engaging member in which a second protrusion is formed. The second protrusion is sized and shaped to engage a second aperture in a second surface of the component when the first protrusion engages the first aperture. The first and second protrusions project in respective directions that are perpendicular to each other so that the projections together substantially prevent motion of the attachment assembly relative to the component.

In another embodiment, the attachment assembly further comprises a third engaging member connected to the first and second engaging members such that the second engaging member is intermediate the first and third engaging members. The first and third engaging members are biased toward each other to clamp the component therebetween when the first and second protrusions engage the first and second apertures, respectively, of the component.

In yet another embodiment of the invention, the attachment assembly further includes a chassis coupling member. The chassis coupling member includes a first engaging portion adapted to engage a first surface of a chassis facing a first direction. The chassis coupling member further includes a second engaging portion adapted to engage a second surface of the chassis facing a second direction opposite the first direction. The first and second engaging portions together resist motion of the computer component relative to the chassis when the attachment assembly is attached to the component and the chassis coupling member engages the chassis.

DETAILED DESCRIPTION OF THE INVENTION

The present invention is embodied in an apparatus and method for removably mounting a computer component to a chassis. An aspect of the invention is that an attachment assembly in accordance with the invention may be mounted to the computer component without the use of screws or other attachment means which require assembly tools. A further aspect of the invention is that an embodiment of the attachment assembly may secure the computer component to the computer chassis, potentially reducing the likelihood that the computer component will move relative to the chassis and damage the chassis or the component. FIGS. 2–6 illustrate various embodiments of the apparatus and methods, and like reference numbers refer to like parts throughout the figures.

Figure 1:
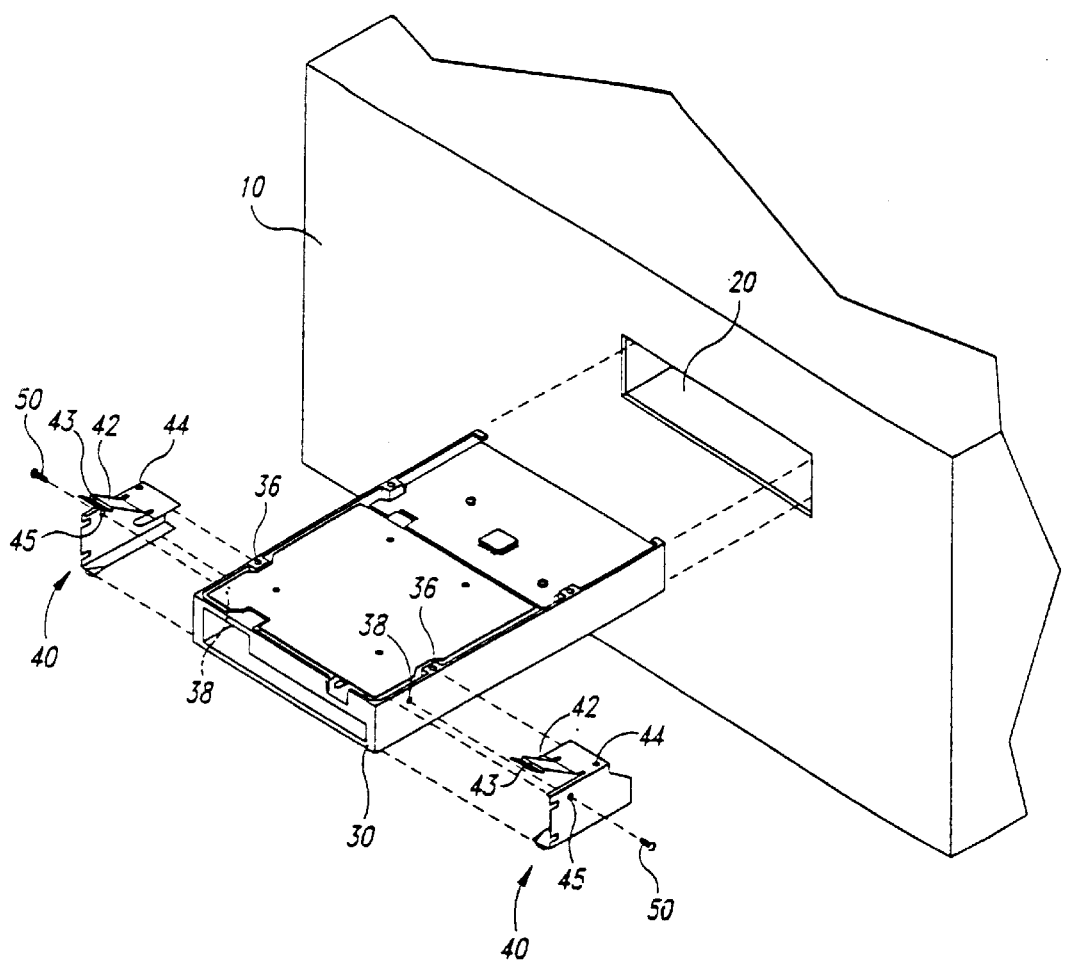
FIG. 1 is an exploded isometric view of a computer chassis, floppy disk drive, and mounting bracket in accordance with the prior art.
Figure 2:
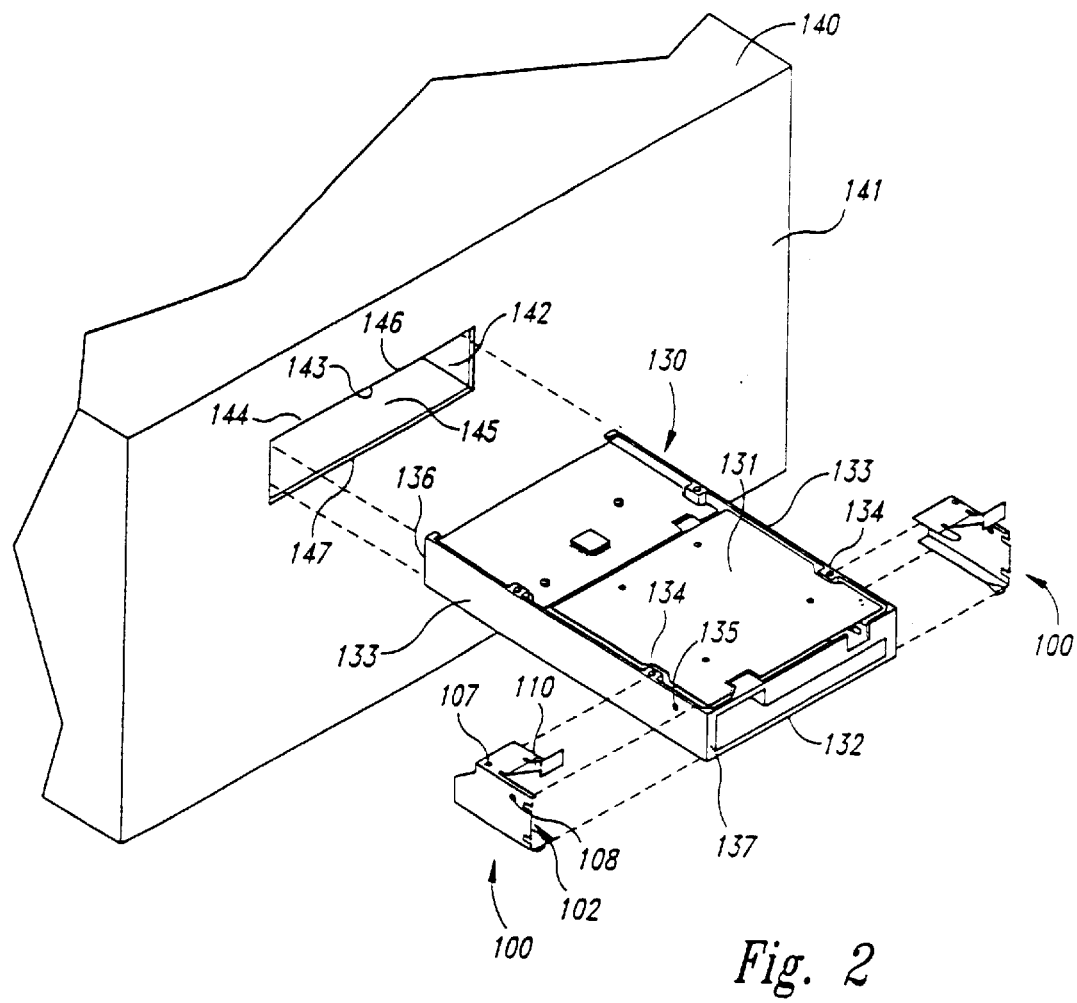
FIG. 2 is an exploded isometric view of a computer chassis, computer component, and attachment assemblies in accordance with one embodiment of the invention.

FIG. 2 is an exploded isometric view of a computer chassis 140 and a representative computer component 130. The chassis 140 has a front panel 141 with an aperture 142 sized and shaped to accommodate the component 130. Two attachment assemblies 100 in accordance with an embodiment of the invention are releasably connected to the component 130 without the use of tools. When the component 130 and attachment assemblies 100 are inserted as a unit into the aperture 142, respective chassis coupling members 110 of the attachment assemblies 100 engage the chassis 140 and restrict motion of the computer component 130 into and out of the aperture 142.

The computer component 130 has an upper surface 131, lower surface 132 and side surfaces 133 intermediate the upper and lower surfaces. First apertures 134 are positioned in the upper surface 131 and second apertures 135 are positioned in each side surface 133. The apertures 134 and 135 may be threaded, but, as discussed below, the apertures need not be threaded for proper operation of the attachment assemblies 100. The component 130 further includes an aft surface 136, which may be inserted into the aperture 142 of the chassis 140, and a forward surface 137 which may remain accessible to a user after the component has been inserted into the aperture. In the embodiment shown in FIG. 2, the component 130 is representative of a floppy disk drive; in other embodiments the component may be any computer component which is removably attachable to the chassis 140.

Figure 3:
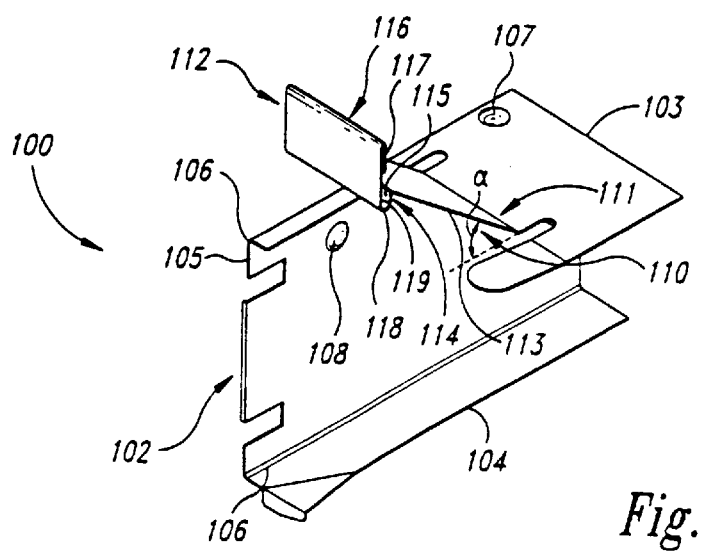
FIG. 3 is an enlarged isometric view of an attachment assembly shown in FIG. 2.

FIG. 3 is an enlarged isometric view of one of the attachment assemblies 100 shown in FIG. 2. Referring to FIGS. 2 and 3, the attachment assembly 100 preferably comprises an attachment member 102, which engages the component 130, and the chassis coupling member 110, which engages the chassis 140. The attachment member 102 comprises a first engaging member 103 connected by a second engaging member 105 to a third engaging member 104. The first and third engaging members 103 and 104 are preferably spaced apart a sufficient distance so that the first engaging member 103 may slidably engage the upper surface 131 of the component 130 while the third engaging member 104 slidably engages the lower surface 132 of the component. In one embodiment, the second engaging 105 is perpendicular to the first and third engaging members 103 and 104, so that the attachment member 102 conforms to the orthogonal surfaces of the component 130. In alternate embodiments, the engaging members 103, 104, and 105 have different orientations relative to one another, corresponding to components 130 having shapes other than the shape shown in FIGS. 2 and 3.

In the embodiment of FIGS. 2 and 3, the engaging members 103, 104, and 105, which together comprise the attachment member 102, are formed from a single sheet of resilient material folded along fold lines 106. In a further aspect of this embodiment, the attachment member 102 may be formed from a spring-like material, such as stainless steel, and the first and third engaging members 103 and 104 may be inclined slightly toward each other. Accordingly, when the attachment member 102 engages the component 130, the first and third engaging members 103 and 104 tend to clamp the component therebetween, restricting the motion of the attachment assembly 100 relative to the component. The second engaging member 105 preferably engages the side surface 133 of the component 130, further restricting motion of the attachment assembly 100 relative to the component.

The attachment member 102 preferably has first and second protrusions 107 and 108 formed in the first and second engaging members 103 and 105. The first protrusion 107 bulges downwardly toward the upper surface 131 of the component 130, and the second protrusion 108 bulges inwardly toward the side surface 133 of the component 130. The protrusions 107 and 108 have circular cross-sectional shapes corresponding to the respective circular cross-sectional shapes of the apertures 134 and 135 so that they may be received by the first and second apertures 134 and 135, respectively.

When the attachment assembly 100 is positioned such that the first engaging member 103 is adjacent the upper surface 131 and the second engaging member 105 is adjacent the side surface 133, the first and second protrusions 107 and 108 are received by the first and second apertures 134 and 135, respectively, to secure the attachment assembly 100 to the component 130. In alternate embodiments, where the component 130 and attachment member 102 may have different corresponding shapes, the protrusions 107 and 108 are similarly received by apertures positioned in surfaces of the component which are in different planes. Accordingly, the protrusions restrict motion of the attachment assembly 100 relative to the component, regardless of the component's shape.

In a preferred embodiment, the first and second protrusions 107 and 108 are longitudinally offset from each other so that the second protrusion engages the component 130 closer to the forward surface 137 of the component than does the first protrusion. The second protrusion 108 accordingly resists forces which may tend to pivot the attachment assembly 102 away from the component 130 about the first protrusion 107. Similarly, the first protrusion 107 resists forces which may tend to pivot the attachment assembly 102 away from the component 130 about the second protrusion 108.

The protrusions 107 and 108 are preferably formed by stamping the attachment member 102 to extrude spherical-shaped dimples therein. In alternate embodiments, other methods may be used to form the protrusions. In further alternate embodiments, the protrusions 107 and 108 may have shapes other than spherical shapes, such as conical shapes, so long as they snugly engage the first and second apertures 134 and 135. Protrusions with further alternate shapes will be discussed in greater detail with reference to FIG. 4.

The attachment assembly 100 is preferably attached to the component 130 by bending the attachment member 102 along the fold lines 106 to slightly spread the first engaging member 103 away from the third engaging member 104. The attachment member 102 is then preferably slipped over the component 130 such that the first engaging member 103 is proximate the upper surface 131 and the third engaging member 104 is proximate the lower surface 132. The first protrusion 107 is aligned with the first aperture 134 and the second protrusion 108 is aligned with the second aperture 135. The first and third engaging members 103 and 104 are then released such that the first and second protrusions 107 and 108 snap into engagement with the first and second apertures 134 and 135, respectively. Although the first and third engaging members 103 and 104 may engage the upper and lower surfaces 131 and 132 of the component 130, and the second engaging member 105 may engage the side surface 133, it is not necessary that they do so, so long as the protrusions 107 and 108 extend sufficiently far into the respective first and second apertures 134 and 135 to restrict motion of the attachment member 102 relative to the component 130.

If for any reason the attachment assembly 100 must later be removed from the component 130, the attachment assembly may be disengaged from the component by bending the attachment member 102 along the fold lines 106 to slightly spread the first engaging member 103 from the third engaging member 104. The attachment member 102 is then moved laterally away from the component.

An advantage of the attachment member 102 shown in FIGS. 2 and 3 is that it may be conveniently attached to the component 130 without the use of assembly tools. Accordingly, the time and effort required to couple the attachment member 102 to the component 130 is reduced. Similarly, the time and effort required to remove the attachment assembly 100 from the component 130, is also reduced. Furthermore, because assembly tools are not required to couple the attachment member 102 to the component 130, the likelihood that a tool will inadvertently slip during assembly and damage the component is greatly reduced.

Another advantage of the attachment member 102 is that the first and second protrusions 107 and 108 together substantially restrict motion of the attachment member 102 and attachment assembly 100 relative to the component 130. The first protrusion 107 engages the first aperture 134 to substantially restrict motion of the attachment member 102 relative to the component 130 along a lateral axis (extending between the side surfaces 133) and along a longitudinal axis (extending between the forward surface 137 and the aft surface 136). The second protrusion 108 engages the second aperture 135 to substantially restrict motion of the attachment member 102 along both the longitudinal axis and a vertical axis (extending between the upper surface 131 and the lower surface 132). Accordingly, because the first and second protrusions 107 and 108 engage apertures positioned in different planes of the component 130, they act together to restrict motion of the attachment member 102 relative to the component along three orthogonal axes. Furthermore, by resisting lateral motion of the attachment member 102 relative to the component 130, the first protrusion 107 reduces the likelihood that the second protrusion 108 will disengage laterally from the second aperture 135. Similarly, by resisting vertical motion of the attachment member 102 relative to the component 130, the second protrusion 108 reduces the likelihood that the first component will disengage vertically from the first aperture 134. In addition, the first protrusion 107 may resist any tendency for the attachment member 102 to pivot about the second protrusion 108, and the second protrusion may resist any tendency for the attachment member to pivot about the first protrusion, as discussed previously.

Yet another advantage of the attachment member 102 is that existing components 130 are typically provided with first and second apertures 134 and 135 already in place. Accordingly, the attachment member 102 may be easily attached to existing components without requiring that the components be modified.

As shown in FIGS. 2 and 3, the attachment member 102 is connected to the chassis coupling member 110 which in turn engages the chassis 140. In one embodiment, the chassis coupling member 110 includes a first end portion 111 attached to the first engaging member 103. A second end portion 112 opposite the first end portion 111 is adapted to engage the computer chassis 140 when the attachment assembly 100 and component 130 are inserted into the component aperture 142. The first end portion 111 and second end portion 112 are connected by a biasing portion 113 which tends to bias the second end portion away from the first engaging member 103.

In one embodiment, the second end portion 112 includes a first portion 114 having a first surface 115 facing forward. The second end portion 112 further includes a second portion 116 having a second surface 117 facing aft. The first and second portions 114 and 116 are connected by a connection portion 118 which, together with the first and second portions, forms a channel 119. The channel 119 is sized and shaped to receive an upper edge 146 of the component aperture 142, as will be discussed in greater detail below.

In a preferred embodiment, the biasing portion 113, which connects the second end portion 112 to the first end portion 111, extends away from the first engaging member 103 at an angle $\alpha$ in the range of approximately 30° to approximately 45°. In alternate embodiments, the biasing portion 113 has other angles relative to the first engaging member 103, so long as the biasing portion provides sufficient force to restrict motion of the component 130 within the aperture 142, as discussed below, and does not provide so much force as to unduly impede insertion of the component into the aperture.

In operation, two attachment assemblies 100 are connected to the component 130, one adjacent each side surface 133 of the component, as discussed above. The component 130, with attachment assemblies 100 in place, is then inserted into the component aperture 142 such that the lower surface 132 of the computer component is adjacent a lower surface 145 of the chassis 140.

As the component 130 is inserted into the aperture 142, the biasing portions 113 engage the upper edge 146 of the aperture and tend to bias the component toward the lower surface 145. When the component 130 is fully inserted into the component aperture 142, each chassis coupling member 110 snaps into engagement with the aperture upper edge 146 such that the first surface 115 engages an inner surface 143 of the panel 141 and the second surface 117 engages an outer surface 144 of the panel. Accordingly, the upper edge 146 fits snugly within the channel 119 formed by the first and second surfaces, and the component 130 is restricted from further motion either into or out of the component aperture 142. The biasing portion 113 of each chassis coupling member 110 tends to bias the computer component 130 against the lower surface 145 of the aperture, further restricting motion of the component within the aperture. At the same time, the biasing portion 113 biases the second end portion 112 upwardly into engagement with the upper edge 146 of the aperture 142. The biasing portion 113 also biases the first protrusion 107 into engagement with the first aperture 134 of the component 130, reducing the likelihood that the attachment assembly 100 will disengage from the component.

To remove the component 130 from the component aperture 142, the user depresses the second end portions 112 of the chassis coupling members 110 downwardly toward the computer component 130 until the upper edge 146 no longer extends into the channels 119. The component 130 can then be slid outwardly from the component aperture 142.

An advantage of the chassis coupling member 110 shown in FIGS. 2 and 3 is that it substantially prevents the component 130 from being inadvertently moved either toward or away from the aperture 142 once installed therein. A further advantage of the chassis coupling member 110 is that the biasing portion 113 extends at a relatively steep angle away from the first engaging member 103. The steep angle increases the normal force between the lower surface 145 of the chassis aperture 142 and the lower surface 132 of the component 130 and between the chassis coupling member 110 and the upper edge 146 of the aperture, further reducing the likelihood that the component will accidentally slip out of the component aperture 142. The steep angle also tends to urge the first protrusion 107 into engagement with the fist aperture 134, as discussed above.

Figure 4:
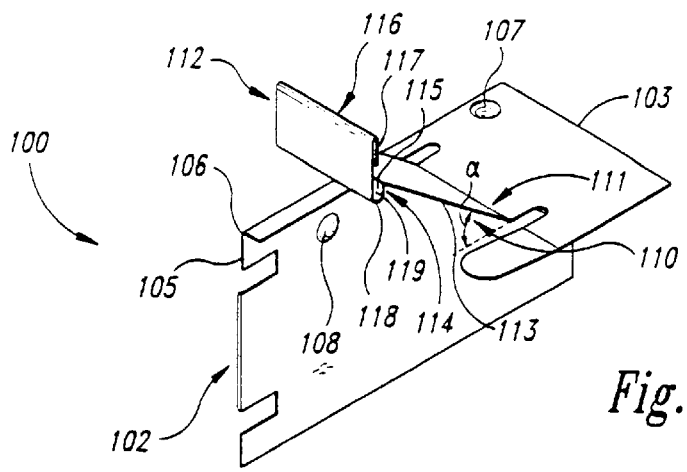
FIG. 4 is an isometric view of an attachment assembly in accordance with a first alternate embodiment of the present invention.

FIG. 4 is an isometric view of a first alternate embodiment of an attachment assembly 100 in which the attachment member 102 comprises a first engaging member 103 connected to a second engaging member 105 without a third engaging member 104. The first protrusion 107 is positioned on the first engaging member 103 and the second protrusion 108 is positioned on the second engaging member 105. The first and second protrusions 107 and 108 are received by the first and second apertures 134 and 135 of the component 130, substantially as discussed previously with respect to FIGS. 2 and 3. The protrusions 107 and 108 extend sufficiently far into the respective apertures 134 and 135 to firmly engage the attachment member 102 with the component 130, eliminating the need, for the attachment member 102 to engage the lower surface 132 of the component.

As shown in FIG. 4, the first engaging member 103 is disposed at an angle of approximately 90° relative to the second engaging member 105, corresponding to an angle between the upper surface 131 and side surface 133 of the component 130. In an alternate embodiment, the first engaging member 103 is disposed at an angle of slightly less than 90° relative to the second engaging member 105. Accordingly, the first and second engaging members 103 and 105 tend to clamp the component 130 therebetween and tend to urge the first and second protrusions 107 and 108 into firm engagement with inner surfaces of the first and second apertures 134 and 135, respectively. In further alternate embodiments, the angle between the first and second engaging members 103 and 105 has other values corresponding to components 130 having other angles between the surfaces engaged by the engaging members.

An advantage of the attachment assembly 100 shown in FIG. 4 is that the amount of material required to manufacture the attachment assembly is reduced by eliminating the third engaging member 104. A further advantage is that the attachment assembly 102 does not extend around the lower surface 132 of the component 130, reducing the tendency for the attachment assembly to catch on a lower edge 47 of the chassis aperture 142 as the component is inserted therein.

Figure 5:
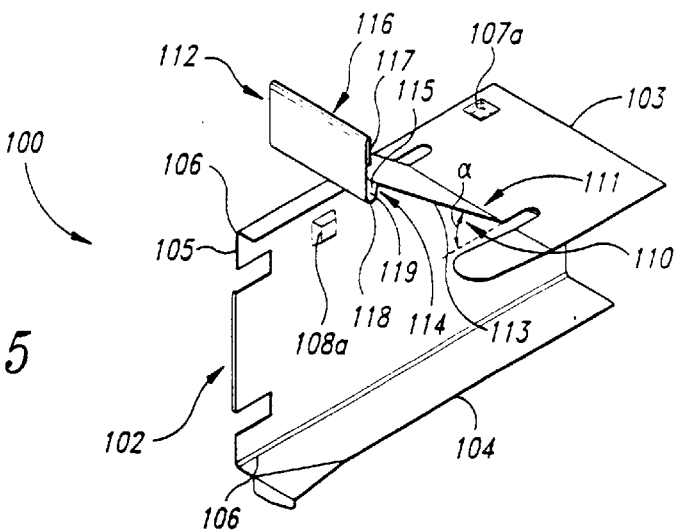
FIG. 5 is an isometric view of an attachment assembly in accordance with a second alternate embodiment of the present invention.

FIG. 5 is an isometric view of a second alternate embodiment of an attachment assembly 100 in which the first and second protrusions 107a and 108a have rectangular, rather than circular, cross-sectional shapes. The protrusions 107a and 108a accordingly engage first and second component apertures (not shown) which have corresponding rectangular cross-sectional shapes so that motion of the attachment assembly 100 with respect to the component 130 is restricted. The protrusions 107a and 108a may project from the first and second engaging members 103 and 105, as shown in FIG. 5, or may project from first and third engaging members 103 and 104 as discussed below with reference to FIG. 6. In further alternate embodiments, the first and second protrusions 107a and 108a may have other shapes which are removably received by corresponding apertures of the component 130.

Figure 6:
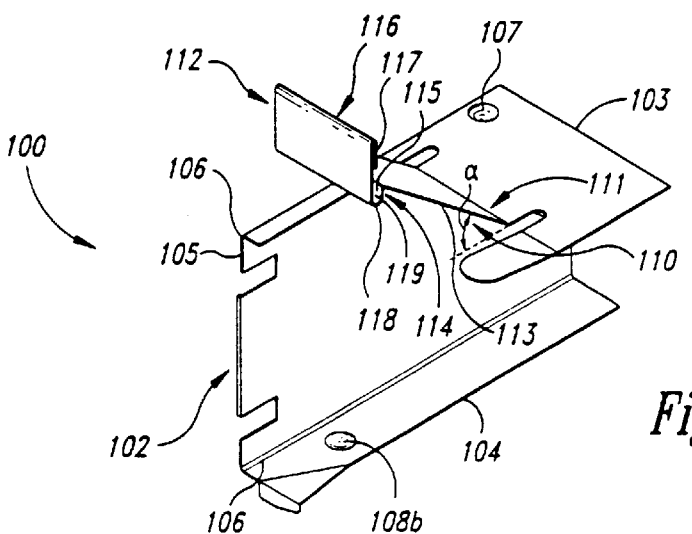
FIG. 6 is an isometric view of an attachment assembly in accordance with a third alternate embodiment of the present invention.

FIG. 6 is an isometric view of a third alternate embodiment of an attachment assembly 100 in which the second protrusion 108b is positioned on the third engaging member 104. The second protrusion 108b is positioned to engage a corresponding aperture (not shown) positioned on the lower surface of the computer component 130. Accordingly, the first and second protrusions 107 and 108b substantially restrict motion of the attachment assembly 100 relative to the component 130. In further alternate embodiments, the protrusions have other locations corresponding to apertures positioned in the component 130, so long as the protrusions engage apertures positioned in surfaces of the component which are oriented in different planes. The protrusions accordingly restrict motion of the attachment assembly relative to the component, as discussed above. In still further alternate embodiments, more than two protrusions engage the component 130 to restrict motion of the assembly 100 relative to the component.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A computer assembly removably coupleable to a chassis, the comprising:

a computer component having a first surface with a first aperture therein and a second surface transverse to the first surface and having a second aperture therein; and an attachment element including
      a first engaging member having a first protrusion received by the first aperture in the first surface of the computer component; and
      a second engaging member connected to the first engaging member, the second engaging member having a second protrusion received by the second aperture in the second surface of the same computer component when the first protrusion is received by the first aperture to generally prevent motion of the attachment element relative to the computer component without threadably securing the attachment element to the computer component.

2. The assembly of claim 1 wherein the first and second engaging members are disposed at an angle of approximately 90 degrees relative to each other.

3. The assembly of claim 1 wherein the first and second engaging members are biased toward each other to clamp the component therebetween when the first and second protrusions are received by the respective first and second apertures.

4. The assembly of claim 1 wherein the first and second engaging members are connected along a common edge and are bendable relative to each other along the common edge to remove the first protrusion from the first aperture.

5. The assembly of claim 1 wherein the first engaging member has a first surface to which the first protrusion is connected, the first surface of the first engaging member being adapted to engage the first surface of the component, and the second engaging member has a second surface to which the second protrusion is connected, the second surface of the second engaging member being adapted to engage the second surface of the component when the first and second protrusions are received by the respective first and second apertures.

6. The assembly of claim 1 wherein the first protrusion is sized and shaped to be removably received by the first aperture.

7. The assembly of claim 1 wherein the first aperture and the first protrusion each have a circular cross-sectional shape.

8. The assembly of claim 1 wherein the first aperture and the first protrusion each have a rectangular cross-sectional shape.

9. A computer assembly removably coupleable to a chassis, comprising:
- a computer component having a first surface with a first aperture therein and a second surface transverse to the first surface and having a second aperture therein; and
- an attachment element including
  - a first engaging member having a first unthreaded protrusion received in the first aperture in the first surface of the component;
  - a second engaging member connected to the first engaging member; and
  - a third engaging member spaced apart from the first engaging member and connected to the second engaging member, the second engaging member having a second unthreaded protrusion received in the second aperture in the second surface of the same computer component when the first protrusion is received in the first aperture to substantially prevent motion of the attachment element relative to the computer component.

10. The assembly of claim 9 wherein the first aperture and the first protrusion each have a circular cross-sectional shape.

11. The assembly of claim 9 wherein the first protrusion is sized and shaped to be removably received by the first aperture of the component.

12. The assembly of claim 9 wherein the first protrusion comprises a dimple formed in the first engaging member.

13. The assembly of claim 9 wherein the first protrusion comprises a dimple formed in the first engaging member, the dimple having an at least partially spherical shape.

14. The assembly of claim 9 wherein the first engaging member has a first surface to which the first protrusion is connected, the first surface of the first engaging member being positioned to engage the first surface of the component when the first protrusion is received by the first aperture, and the one of the second and third engaging members having the second protrusion has a second surface to which the second protrusion is connected, the second surface of the assembly being positioned to engage the second surface of the component when the second protrusion is received by the second aperture.

15. The assembly of claim 9 wherein the first and third engaging members are biased toward each other to clamp the component therebetween when the first protrusion is received by the first aperture and the second protrusion is received by the second aperture.

16. The assembly of claim 9 wherein the first and second engaging members are connected along a common edge and are bendable away from each other along the common edge to remove the first protrusion from the first aperture.

17. The assembly of claim 9 wherein the second and third engaging members are connected along a common edge and are bendable away from each other along the common edge to remove the second protrusion from the second aperture.

18. The assembly of claim 9 wherein the first, second, and third engaging members are integrally formed from a single piece of flexible resilient material.

19. A computer assembly releasably securable to a computer chassis, comprising:
- a computer component having first, second, and third surfaces, the first and third surfaces being spaced apart from each other and substantially parallel to each other and the second surface being connected to and substantially perpendicular to the first and third surfaces;
- an attachment element including
  - an attachment member having a first, second, and third engaging portions, the first engaging portion having a substantially flat surface facing the first surface of the computer component with a first unthreaded protrusion extending toward the first surface of the computer component received in a first aperture in the first surface of the component, the third engaging portion having a generally flat surface spaced apart from and generally parallel to the first engaging portion, the third engaging portion facing the third surface of the computer component, the second engaging portion being connected to and extending between the first and third engaging portions transverse to both the first and third engaging portions and facing the second surface of the computer component, the second engaging portion having a second unthreaded protrusion extending toward the same computer component, the second protrusion being received in a second aperture in the second surface of the same computer component; and
- a chassis coupling member having a first end connected to the attachment member and a second end extending away from the first end and adapted to engage the computer chassis when the computer component is positioned within the aperture of the chassis.

20. The assembly of claim 19 wherein the first and third engaging portions of the attachment assembly are substantially perpendicular to the second engaging portion thereof.

21. The assembly of claim 19 wherein the first aperture and the first protrusion each have a circular cross-sectional shape and the first protrusion is sized and shaped to be removably received by the first protrusion.

22. The assembly of claim 19 wherein the first protrusion comprises a dimple integrally formed in the first engaging portion.

23. The assembly of claim 19 wherein the first protrusion comprises a dimple integrally formed in the first engaging portion, the dimple having an at least partially spherical shape.

24. The assembly of claim 19 wherein the first and third engaging portions are biased toward each other to clamp the component therebetween when the first and third engaging portions engage the component.

25. A computer assembly, comprising:
- a computer chassis having an aperture in a panel with a forward-facing surface and a rearward-facing surface facing opposite the forward-facing surface;
- a computer component having a first surface with a first aperture and a second surface transverse to the first surface and having a second aperture transverse to the first aperture, the computer component being sized to fit within the aperture of the chassis; and
- an attachment element including
  - an attachment member removably received in the first and second apertures of the computer component without threaded fasteners; and a chassis coupling member having opposite first and second ends, the first end connected to the attachment member and the second end including a first portion adapted to engage the forward-facing surface of the chassis and a second portion facing the first portion and adapted to engage the rearward-facing surface of the chassis to resist motion of the computer component relative to the chassis, the first portion of the chassis coupling member being flexibly coupled to the attachment member, accessible from the forward-facing surface and movable between an engaged position with the first portion engaged with the chassis and a disengaged position with the first portion and the computer component removed as a unit from the chassis.

26. The assembly of claim 25 wherein the chassis coupling member comprises a flexible resilient material and extends at an angle in the range of approximately 15 degrees to approximately 45 degrees away from the attachment member to bias the component away from the first and second surfaces of the chassis when the chassis coupling member engages the chassis.

27. The assembly of claim 25 wherein the chassis includes a panel having an aperture therethrough sized and shaped to removably receive the component, the first and second surfaces of the chassis comprising opposite-facing surfaces of the panel, and the first portion has a first surface facing and engaging the first surface of the chassis and the second portion has a second surface facing and engaging the second surface of the chassis when the chassis coupling member engages the chassis.

* * * * *

UNITED STATES PATENT AND TRADEMARK OFFICE
CERTIFICATE OF CORRECTION

PATENT NO.    : 6,158,699
DATED         : December 12, 2000
INVENTOR(S)   : Boe

It is certified that error appears in the above-identified patent and that said Letters Patent is hereby corrected as shown below:

Column 8,
Line 36, "sccond" should be -- second --;

Signed and Sealed this

Ninth Day of September, 2003

JAMES E. ROGAN
*Director of the United States Patent and Trademark Office*